United States Patent
Han et al.

(10) Patent No.: US 12,016,217 B2
(45) Date of Patent: Jun. 18, 2024

(54) DISPLAY PANEL AND DISPLAY DEVICE INCLUDING CRACK DETECTION LINE ELECTRICALLY CONNECTING FIRST AND SECOND PINS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Linhong Han, Beijing (CN); Tinghua Shang, Beijing (CN); Pengfei Yu, Beijing (CN); Shun Zhang, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 238 days.

(21) Appl. No.: 17/265,293

(22) PCT Filed: Apr. 14, 2020

(86) PCT No.: PCT/CN2020/084678
§ 371 (c)(1),
(2) Date: Feb. 2, 2021

(87) PCT Pub. No.: WO2021/207924
PCT Pub. Date: Oct. 21, 2021

(65) Prior Publication Data
US 2022/0190088 A1  Jun. 16, 2022

(51) Int. Cl.
*H10K 59/131* (2023.01)
*H01L 23/00* (2006.01)
(Continued)

(52) U.S. Cl.
CPC ............ *H10K 59/131* (2023.02); *H01L 24/05* (2013.01); *H01L 24/06* (2013.01); *H01L 24/32* (2013.01);
(Continued)

(58) Field of Classification Search
CPC ...... H10K 59/00; H10K 59/12; H10K 59/131; H10K 59/88; H01L 24/05; H01L 24/06; H01L 24/32; H01L 2224/0603
(Continued)

(56) References Cited

U.S. PATENT DOCUMENTS

2014/0267683 A1* 9/2014 Bibi ........................ H10K 50/00
                                                                      348/87
2019/0057632 A1   2/2019 Kim et al.
(Continued)

FOREIGN PATENT DOCUMENTS

CN  203324610 U  * 12/2013  ............... G02F 1/13
CN  203324610 U    12/2013
(Continued)

OTHER PUBLICATIONS

English Translation of International Preliminary Report on Patentability regarding App. No. PCT/CN2020/084678, dated Oct. 13, 2022 (Year: 2022).*

(Continued)

*Primary Examiner* — Matthew E. Gordon
(74) *Attorney, Agent, or Firm* — DINSMORE & SHOHL LLP (57) ABSTRACT

The present disclosure provides a display panel and a display device. The display panel includes: a display substrate, an IC chip, and a circuit board. The display substrate includes a first bonding portion including a first detection pin and a second detection pin, a second bonding portion connected to the first bonding portion and including a first
(Continued)

connection pin and second connection pin which are connected by a connection wire included by the circuit board, a first connection line connecting the first detection pin to the first connection pin and including a first crack detection line, and a second connection line connecting the first detection pin to the second connection pin. The IC chip is bonded to the first bonding portion and configured to determine cracks on an edge of the display substrate according to electric signals of the first detection pin and the second detection pin.

17 Claims, 6 Drawing Sheets

(51) Int. Cl.
    *H01L 25/18*     (2023.01)
    *H10K 59/88*     (2023.01)
    *H10K 77/10*     (2023.01)
    *H10K 102/00*     (2023.01)

(52) U.S. Cl.
    CPC .... *H01L 25/18* (2013.01); *H01L 2224/05548* (2013.01); *H01L 2224/0603* (2013.01); *H01L 2224/32145* (2013.01); *H01L 2224/32225* (2013.01); *H10K 59/88* (2023.02); *H10K 77/111* (2023.02); *H10K 2102/311* (2023.02)

(58) Field of Classification Search
    USPC .......................................................... 257/40
    See application file for complete search history.

(56) References Cited

U.S. PATENT DOCUMENTS

| | | | |
|---|---|---|---|
| 2019/0066595 A1 | 2/2019 | Kawng-Min et al. | |
| 2020/0371627 A1 | 11/2020 | Hongqiang et al. | |
| 2021/0247859 A1 | 8/2021 | Gong et al. | |

FOREIGN PATENT DOCUMENTS

| | | | | |
|---|---|---|---|---|
| CN | 107742477 A | * | 2/2018 | ............. G09F 9/301 |
| CN | 107742477 A | | 2/2018 | |
| CN | 108154800 A | | 6/2018 | |
| CN | 108762562 A | | 11/2018 | |
| CN | 108922909 A | | 11/2018 | |
| CN | 108922909 A | * | 11/2018 | ............. G09G 3/006 |
| CN | 109256045 A | | 1/2019 | |
| CN | 109375399 A | | 2/2019 | |
| CN | 109427273 A | | 3/2019 | |
| CN | 109427752 A | | 3/2019 | |
| CN | 109739386 A | | 5/2019 | |
| CN | 110634411 A | * | 12/2019 | ............. G09F 9/301 |
| CN | 110634411 A | | 12/2019 | |
| EP | 3330951 A2 | | 6/2018 | |
| EP | 3435434 A2 | | 1/2019 | |
| EP | 3457822 A1 | * | 3/2019 | ......... G01R 31/2818 |
| EP | 3186835 B1 | | 9/2020 | |
| EP | 3806076 A1 | | 4/2021 | |
| KR | 20070111717 A | | 11/2007 | |
| WO | 2019235823 A1 | | 12/2019 | |

OTHER PUBLICATIONS

Chinese Office Action & Search Report dated May 11, 2022, relating to Chinese Patent Application No. 202080000527.8.

* cited by examiner

DISPLAY PANEL AND DISPLAY DEVICE INCLUDING CRACK DETECTION LINE ELECTRICALLY CONNECTING FIRST AND SECOND PINS

CROSS-REFERENCE TO RELATED APPLICATIONS

The present application is a U.S. National Stage Application under 35 U.S.C. § 371 of International Patent Application No. PCT/CN2020/084678, filed on Apr. 14, 2020, the disclosure of which is incorporated by reference herein in its entirety.

TECHNICAL FIELD

The present disclosure relates to the field of display technology, and in particular to a display panel and a display device.

BACKGROUND

With the advantages such as light weight and thin size, bendability, low power consumption, wide color gamut, and high contrast, the organic light-emitting display device is listed as a next-generation display technology with a significant development prospect. The production yield of the organic light-emitting display panel is a key problem that restricts a large-scale application of the organic light-emitting display device.

SUMMARY

According to one aspect of the embodiments of the present disclosure, a display panel is provided. The display panel includes: a display substrate including a display area and a non-display area surrounding the display area, wherein the display substrate includes a substrate, as well as a first bonding portion, a second bonding portion, a first connection line and a second connection line, which are located on one side of the substrate and located in the non-display area, wherein: the first bonding portion includes a plurality of first pins including a first detection pin and a second detection pin; the second bonding portion is located on one side of the first bonding portion away from the display area and connected to the first bonding portion, the second bonding portion includes a plurality of second pins including a first connection pin and second connection pin; the first connection line connects the first detection pin to the first connection pin, and includes a first crack detection line arranged around at least a portion of edge of the display area; and the second connection line connects the second detection pin to the second connection pin; an integrated circuit chip bonded to the first bonding portion, and configured to drive the display substrate to display according to a signal of a main board, and to determine whether there is a crack on an edge of the display substrate according to electric signals of the first detection pin and the second detection pin; and a circuit board bonded to the second bonding portion and configured to transmit a signal of the main board to the integrated circuit chip, wherein the circuit board includes a connection wire that connects the first connection pin to the second connection pin.

In some embodiments, the second connection line includes a second crack detection line arranged around at least a portion of edges of the display area.

In some embodiments, the first crack detection line is arranged around a first portion of edges of the display area, the second crack detection line is arranged around a second portion of edges of the display area, and the first portion of edges does not overlap with the second portion of edges or partially overlap with the second portion of edges.

In some embodiments, the first connection line includes a first lead wire connecting one end of the first crack detection line to the first detection pin, and a second lead wire connecting another end of the first crack detection line to the first connection pin, wherein an orthographic projection of the second lead wire does not overlap with an orthographic projection of the first bonding portion on the substrate; and the second connection line includes a third lead wire connecting one end of the second crack detection line to the second detection pin, and a fourth lead wire connecting another end of the second crack detection line to the second connection pin, wherein an orthographic projection of the fourth lead wire does not overlap with the orthographic projection of the first bonding portion on the substrate.

In some embodiments, an orthographic projection of the connection wire does not overlap with an orthographic projection of the second bonding portion on the substrate.

In some embodiments, the display substrate includes: a semiconductor layer, a first insulation layer, a first gate metal layer, a second insulation layer, and a second gate metal layer, a third insulation layer and a data metal layer located on one side of the substrate and arranged sequentially along a direction away from the substrate; the first pin includes: a first transmission sub-layer located in the first gate metal layer, and a second transmission sub-layer located in the data metal layer and connected to the first transmission sub-layer through a via hole; and the second pin includes a single-layer transmission portion located in the data metal layer.

In some embodiments, the first lead wire and the third lead wire are located in the first gate metal layer; and the second lead wire and the fourth lead wire are located in the second gate metal layer, the second lead wire is connected to the first connection pin through a via hole, and the fourth lead wire is connected to the second connection pin through a via hole.

In some embodiments, the substrate is a flexible substrate, the display area is substantially polygonal, and the first bonding portion is adjacent to one side of the display area; the display substrate further includes a bending portion located on one side of the substrate and between the display area and the first bonding portion, and the bending portion includes a plurality of dummy wires that are arranged at intervals and substantially perpendicular to the side, wherein the plurality of dummy wires are located in the data metal layer; and an orthographic projection of any one of the first lead wire, the second lead wire, the third lead wire, and the fourth lead wire on the substrate is located between orthographic projections of two adjacent dummy wires on the substrate.

In some embodiments, each of the first crack detection line and the second crack detection line includes a plurality of first detection sections and a plurality of second detection sections that are alternately provided, wherein the first detection section is located in the second gate metal layer, the second detection section is located in the data metal layer, and the first detection section is connected to the second detection section through a via hole.

In some embodiments, the display area is substantially polygonal, the first bonding portion is adjacent to one side of the display area, and at least one of the second detection sections is adjacent to a corner of the display area.

In some embodiments, the second bonding portion is connected to the first bonding portion by a plurality of internal pins which are located in the data metal layer; the plurality of second pins further include a first external test pin and a second external test pin, wherein the first external test pin is connected to the first test pin through one internal pin, and the second external test pin is connected to the second test pin through one internal pin.

In some embodiments, the first crack detection line surrounding the first portion of edges of the display area is in a roundabout shape; and/or, the second crack detection line surrounding the second portion of edges of the display area is in a roundabout shape.

In some embodiments, at least a portion of the first crack detection line extends in a wave form; and/or at least a portion of the second crack detection line extends in a wave form.

In some embodiments, the first crack detection line and the second crack detection line have substantially the same length.

In some embodiments, the material of the connection wire includes copper.

In some embodiments, the display panel is an organic light-emitting display panel; and the display substrate further includes an encapsulation layer exposing the plurality of first pins of the first bonding portion and the plurality of second pins of the second bonding portion.

According to another aspect of the embodiments of the present disclosure, a display device is provided. The display device includes: the display panel according to any one of the foregoing embodiments.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The words "first", "second", and similar words used in the present disclosure do not denote any order, quantity or importance, but merely serve to distinguish different parts. Such similar words as "comprise/include" or "contain" mean that the element preceding the word encompasses the elements enumerated after the word, and does not exclude the possibility of encompassing other elements as well. The terms "up", "down", "left", "right", or the like are used only to represent a relative positional relationship, and the relative positional relationship may also be changed correspondingly if the absolute position of the described object changes.

In the present disclosure, when it is described that a particular member is located between the first member and the second member, there may be an intermediate member between the particular member and the first member or the second member, and alternatively, there may be no intermediate member. When it is described that a particular member is connected to other members, the particular member may be directly connected to said other members without an intermediate member, and alternatively, may not be directly connected to said other members but with an intermediate member.

Unless otherwise specifically defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

With the characteristics such as light weight, thin size and flexibility, the organic light-emitting display panel is widely applied in a flexible display device product. Moisture and oxygen in the air are main factors affecting the service life of the organic light-emitting display panel. In one related technology, a Thin Film Encapsulation (TFE) technology is used to encapsulate and protect a substrate containing an organic light-emitting device and its driving circuit to prevent intrusion of moisture and oxygen.

During the process of implementing the embodiments of the present disclosure, the inventors of the present disclosure have noticed that, during the production process of the organic light-emitting display panel, a crack might have been produced at an edge. If the crack is not checked out in time, a direct consequence is that moisture and oxygen intrude the display area, which causes malfunction of the organic light-emitting device. To solve this technical problem, the embodiments of the present disclosure provide a display panel and a display device. In the following various embodiments of the present disclosure, a connection refers to an electrical connection.

Figure 1:
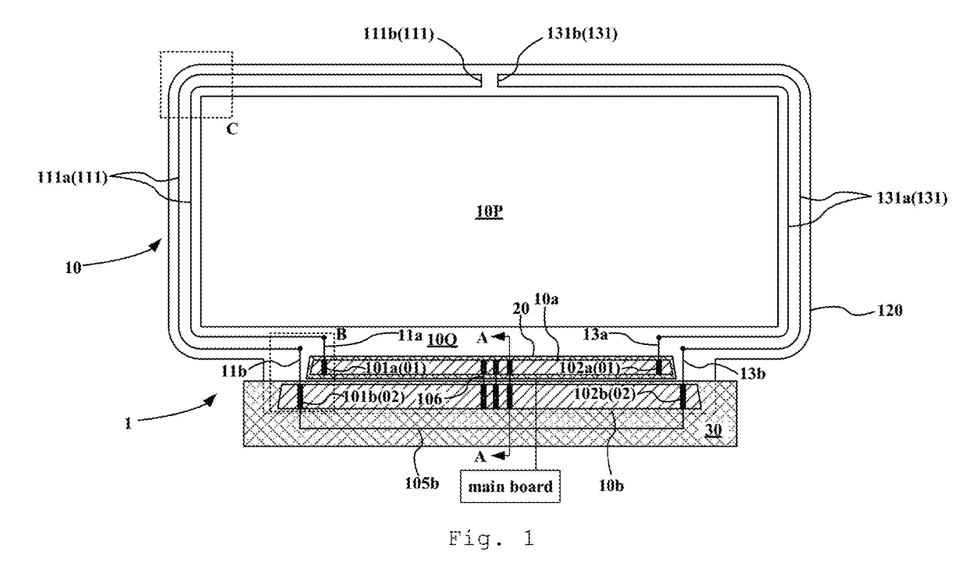
FIG. 1 is a front view of a display panel according to one embodiment of the present disclosure.

As shown in FIG. 1, the display panel 1 provided by one embodiment of the present disclosure includes: a display substrate 10, an integrated circuit chip 20 (IC) and a circuit board 30.

The display substrate 10 includes a display area 10P and a non-display area 10Q surrounding the display area 10P. The display substrate 10 includes a substrate 120, and a first bonding portion 10a, a second bonding portion 10b, a first connection line, and a second connection line located on one side of the substrate 120 and located in the non-display area 10Q. The first bonding portion 10a includes a plurality of first pins 01 including a first detection pin 101a and a second detection pin 102a; and the second bonding portion 10b is located on one side of the first bonding portion 10a away from the display area 10P and connected to the first bonding portion 10a. The second bonding portion 10b includes a plurality of second pins 02 including a first connection pin 101b and a second connection pin 102b. The first connection line connects the first detection pin 101a to the first connection pin 101b, and includes a first crack detection line 111 arranged around at least a portion of edges of the display area 10P; and the second connection line connects the second detection pin 102a to the second connection pin 102b.

The integrated circuit chip 20 is bonded to the first bonding portion 10a, and configured to drive the display substrate 10 to display according to a signal of a main board, and determine whether there is a crack on an edge of the display substrate 10 according to electrical signals of the first detection pin 101a and the second detection pin 102a.

The circuit board 30 is bonded to the second bonding portion 10b for transmitting a signal of the main board to the IC 20. The circuit board 30 includes a connection wire 105b, which connects the first connection pin 101b to the second connection pin 102b.

Figure 2A:
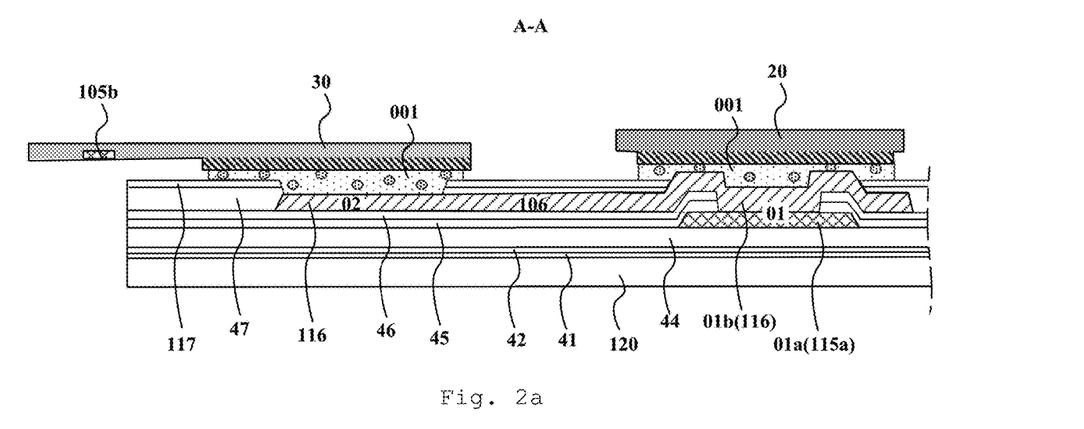
FIG. 2a is a schematic cross-sectional view taken along an A-A direction of the display panel shown in FIG. 1.

The display area 10P of the display substrate 10 is configured to display an image, and the non-display area 10Q of the display substrate 10 is configured to arrange a related circuit and a related electronic element so as to support the display of the display area 10P. In the embodiments of the present disclosure, the first bonding portion 10a of the display substrate 10 includes a plurality of first pins 01 which are bonded (i.e., linked) in a one-to-one correspondence with the plurality of pins of the IC 20, thereby implementing transmitting an electrical signal between the first bonding portion 10a and the IC 20. Similarly, the second bonding portion 10b of the display substrate 10 includes a plurality of second pins 02 which are bonded in a one-to-one correspondence with the plurality of pins of the circuit board 30, thereby implementing transmitting an electrical signal between the second bonding portion 10b and the circuit board 30. Some second pins 02 of the second bonding portion 10b may be connected to some first pins 01 of the first bonding portion 10a through an internal pin (also referred to as ILB) 106, thereby implementing transmitting an electrical signal between the second bonding portion 10b and the first bonding portion 10a. The circuit board 30 is connected to the main board (shown in FIG. 1) of the display device, so that the signal of the main board may be transmitted to the IC 20 through the second bonding portion 10b and the first bonding portion 10a. The circuit board 30 is, for example, a flexible printed circuit (FPC). The main function of the IC 20 is to provide a driving signal, a data signal, a clock signal and the like to the display area 10P according to a signal of the main board, thereby driving the display substrate 10 to display. As shown in FIGS. 1 and 2a, in some embodiments of the present disclosure, the bonding between the pin of the IC 20 and the first pin 01 of the first bonding portion 10a, and the bonding between the pin of the circuit board 30 and the second pin 02 of the second bonding portion 10b are implemented by a conductive adhesive film 001. The conductive adhesive film 001 is, for example, an anisotropic conductive film (ACF).

In the embodiments of the present disclosure, the specific shape of the display area 10P of the display substrate 10 is not limited, such as circular, elliptical, polygonal, or the like. In some embodiments of the present disclosure, the display area 10P is substantially polygonal, for example, substantially rectangular as shown in FIG. 1. The first bonding portion 10a is adjacent to one of the sides of the display area 10P. For example, the first bonding portion 10a is adjacent to one of the long sides of the substantially rectangular display area 10P. The second bonding portion 10b is located on one side of the first bonding portion 10a away from the display area 10P. The display area is substantially polygonal, and it may be understood that: the shape of the display area is polygon after ignoring a round chamfer, a bevel chamfer, or a process error of the display area.

Figure 2B:
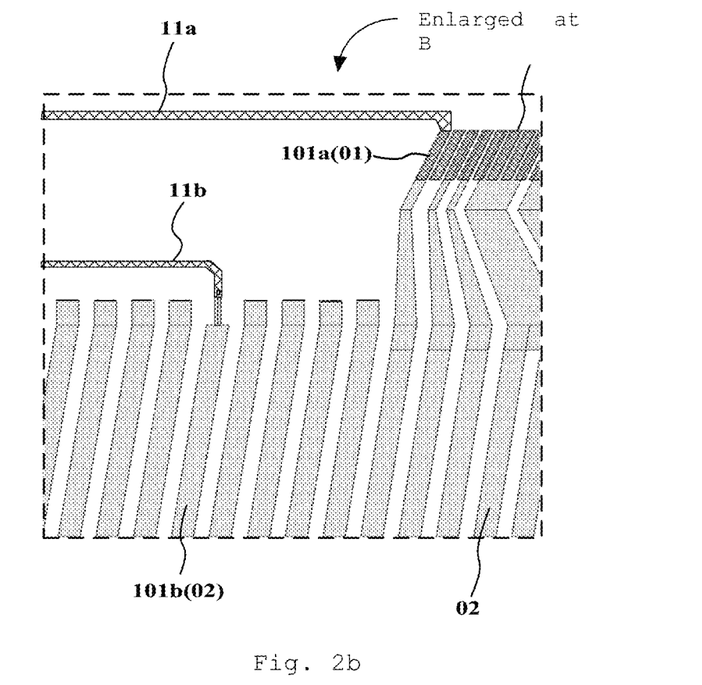
FIG. 2b is a partially enlarged schematic view of B of the display panel shown in FIG. 1.

In some embodiments of the present disclosure, the display substrate 10 is an active matrix organic light-emitting diode (AMOLED) display substrate. As shown in FIG. 2d, the pixel structure of the display area 10P of the AMOLED display substrate includes an organic light emitting device 121, a thin film transistor device 122, and a capacitive device 123. Each organic light emitting device 121 which is controlled by the thin film transistor device 122, may emit light independently and continuously. In some other embodiments of the present disclosure, the display substrate may also be a passive matrix organic light-emitting diode (PMOLED) display substrate. The display principle of the PMOLED display substrate is to light up the organic light-emitting devices arranged in an array in the display area in a scanning manner, so that each organic light-emitting device instantly emits light under a short pulse.

In some embodiments of the present disclosure, the display substrate 10 is an AMOLED display substrate, wherein the substrate 120 thereof may be a flexible substrate or a hard substrate, and the specific material type of the substrate 120 is not limited. For example, in some embodiments, the substrate 120 is a flexible substrate, and the material of the substrate includes polyimide. In other embodiments, the substrate 120 is a hard substrate, and the material includes glass or resin.

As shown in FIGS. 2a and 2d, in some embodiments of the present disclosure, the structure of the AMOLED display substrate includes: a barrier layer 41, a buffer layer 42, a semiconductor layer 43, a first insulation layer 44, a first gate metal layer 115a, a second insulation layer 45, a second gate metal layer 115b, a third insulation layer 46, a data metal layer 116, a flat layer 47, an anode layer 48, a pixel defining layer 49, an organic functional layer 50, a cathode layer 51 and an encapsulation layer 117 that are located on one side of the substrate 120 and sequentially arranged along a direction away from the substrate 120. The encapsulation layer 117 exposes a plurality of first pins 01 of the first bonding portion 10a and a plurality of second pins 02 of the second bonding portion 10b. In some embodiments of the present disclosure, the display panel is a touch display panel, and the display substrate further includes a touch structure layer located on one side of the encapsulation layer away from the substrate.

In the embodiments of the present disclosure, in addition to providing a display-related signal to the display area 10P, the IC 20 is also configured to determine whether there is a crack on an edge of the display substrate 10 according to electrical signals of the first detection pin 101a and the second detection pin 102a such as a potential difference. As shown in FIG. 1, the first detection pin 101a, the first connection line, the first connection pin 101b, the connection wire 105b, the second connection pin 102b, the second connection line and the second detection pin 102a are sequentially connected to form a crack detection circuit, wherein the first crack detection line 111 included in the first connection line is arranged around at least a portion of edges of the display area 10P. If there is a crack on an edge of the first substrate 10, the first crack detection line 111 is also very likely to produce a crack or even a break under the action of a crack stress. The resistance value of the first crack detection line 111 may increase greatly after a crack occurs, and the crack detection circuit may suffer from open-circuit after the first crack detection line 111 is broken. Therefore, by detecting the electrical signals of the first detection pin 101a and the second detection pin 102a, it may be substantially determined whether there is a crack on an edge of the display substrate 10. In the production stage of the display panel, by timely screening out defective products with cracks, it is possible to improve the product quality of the display device and avoid a large amount of waste of manpower and materials.

As shown in FIG. 1, in some embodiments of the present disclosure, the first connection line includes a first crack detection line 111 surrounding a first portion of edges of the display area 10P, and the second connection line includes a second crack detection line 131 surrounding a second portion of edges of the display area 10P, wherein there is no overlap between the first portion and the second portion of edges of the display area 10P. The greater the length of an edge of the display area 10P surrounded by the crack detection line is, that is, the greater the sum of length of the first portion of edge and length of the second portion of edge of the display area 10P is, the more accurate the detection of a crack on an edge of the display substrate 10 by the IC 20 will be.

As shown in FIG. 1, the first connection line includes a first lead wire 11a connecting one end of the first crack detection line 111 and the first detection pin 101a, and second lead wire 11b connecting another end of the first crack detection line 111 and the first connection pin 101b, wherein an orthographic projection of the second lead wire 11b does not overlap with an orthographic projection of the first bonding portion 10a on the substrate 120. Similarly, the second connection line includes a third lead wire 13a connecting one end of the second crack detection line 131 and the second detection pin 102a, and a fourth lead wire 13b connecting another end of the second crack detection line 131 and the second connection pin 102b, wherein an orthographic projection of the fourth lead wire 13b does not overlap with an orthographic projection of the first bonding portion 10a on the substrate 120.

Since the IC 20 is required to provide many signals such as a driving signal, a data signal, and a clock signal to the display area 10P, the structural design of the first bonding portion 10a is more complicated than that of the second bonding portion 10b. In addition, in order to reliably connect the IC 20 and the first bonding portion 10a, the external force required to be applied is relatively large when the IC 20 is bonded to the first bonding portion 10a. During the process of implementing the embodiments of the present disclosure, the inventors of the present disclosure have discovered that, if a part of trace of the crack detection circuit of the display panel passes through the IC bonding portion along a length direction of the IC bonding portion, then this portion of trace is also required to avoid a pin on the IC bonding portion by a jumper design. In this way, the structural complexity and manufacturing difficulty of the IC bonding portion are doubled, so that not only it is likely to produce a poor process with a high process cost, but also it is possible to increase the possibility that the circuit structure is damaged due to a bonding stress.

In the embodiments of the present disclosure, in addition that the first detection pin 101a and the second detection pin 102a of the crack detection circuit are arranged in the first bonding portion 10a, its trace structure is substantially arranged outside an area in which the first bonding portion 10a is situated, and the connection wire 105b as a part of the crack detection circuit is also arranged on the circuit board 30. The first detection pin 101a and the second detection pin 102a have similar structures to other first pins. Therefore, compared with the above-described related technologies, the embodiments of the present disclosure may reduce the structural complexity and manufacturing difficulty of the first bonding portion 10a, thereby reducing the occurrence of a poor process, reducing the process cost, and reducing possibility that the circuit structure is damaged due to a bonding stress.

In addition, in the embodiments of the present disclosure, the trace structure of the crack detection circuit is substantially arranged outside the area where the first bonding portion 10a is situated, which also greatly increases the degree of freedom of the trace design so that a projection position of the trace on the substrate 120, a material of the trace, and a layer position of the trace may be selected flexibly. Therefore, it is more favorable for optimizing an electrical performance of the display substrate.

As shown in FIG. 1, an orthographic projection of the connection wire 105b on the circuit board 30 does not overlap with an orthographic projection of the second bonding portion 10b on the substrate 120. In other words, after the circuit board 30 is bonded to the second bonding portion 10b, the connection wire 105b is located outside the area where the second bonding portion 10b is situated, and the connection wire 105b is substantially not affected by a bonding force, which makes a more reliable connection between the circuit board 30 and the second bonding portion 10b. Moreover, there is also a higher flexibility in the layer position of the connection wire 105b on the circuit board 30 and the material selection thereof. In some embodiments, the material of the connection wire 105b includes copper.

The specific structures of the first pin 01 and the second pin 02 are not limited. As shown in FIG. 2a and FIG. 2b, in some embodiments, the first pin 01 includes: a first transmission sub-layer 01a located in the first gate metal layer 115a, and a second transmission sub-layer 01b located in the data metal layer 116 and connected to the first transmission sub-layer 01a through a via hole, wherein the second pin 02 is a single-layer transmission portion located in the data metal layer 116. In addition, the internal pin 106 connecting the first bonding portion 10a and the second bonding portion 10b is also located in the data metal layer 116. In order to simplify the manufacturing process, the first lead wire 11a and the third lead wire 13a are arranged in the first gate metal layer 115a, and manufactured and connected with the first transmission sub-layer of each first pin 01 in the same layer.

As mentioned above, since the second lead wire 11b and the fourth lead wire 13b are arranged outside the area where the first bonding portion 10a is situated, the structural forms of the second lead wire 11b and the fourth lead wire 13b may be flexibly selected. For example, the second lead wire 11b and the fourth lead wire 13b are located in the first gate metal layer 115a, or the second lead wire 11b and the fourth lead wire 13b are located in the second gate metal layer 115b, or the second lead wire 11b and the fourth lead wire 13b both include two stacked sub-layers which are respectively located in the first gate metal layer 115a and the second gate metal layer 115b, and so forth. In some embodiments, the second lead wire 11b and the fourth lead wire 13b are located in the second gate metal layer 115b, the second lead wire 11b is connected to the first connection pin 101b through a via hole, and the fourth lead wire 13b is connected to the second connection pin 102b through a via hole.

Figure 3:
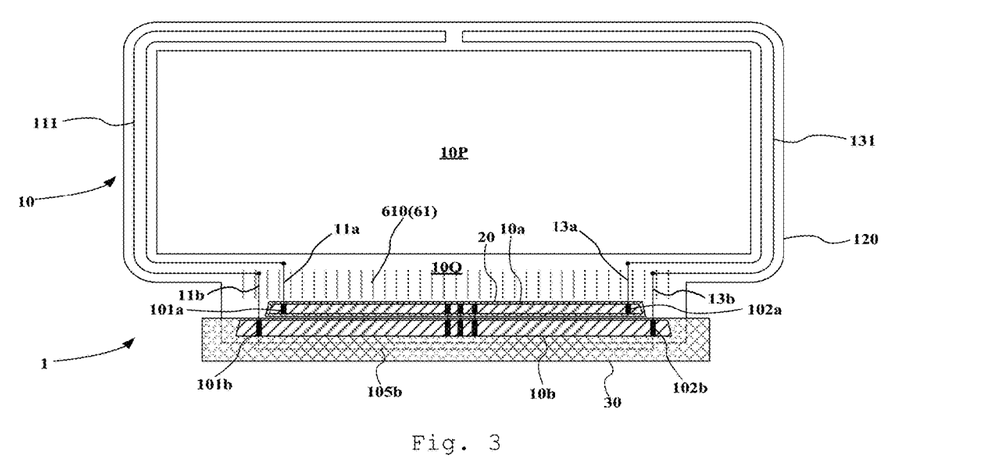
FIG. 3 is a front view of a display panel according to another embodiment of the present disclosure.

As shown in FIG. 3, in some embodiments of the present disclosure, the substrate 120 is a flexible substrate, the display area 10P is substantially polygonal, and the first bonding portion 10a is adjacent to one side of the display area 10P; the display substrate 10 also includes a bending portion 61 located on one side of the substrate 120 and located between the display area 10P and the first bonding portion 10a. The bending portion 61 includes a plurality of dummy wires 610 arranged at intervals and substantially perpendicular to the side. The plurality of dummy wires 610 are located in the data metal layer 116 described previously. An orthographic projection of any one of the first lead wire 11a, the second lead wire 11b, the third lead wire 13a, and the fourth lead wire 13b on the substrate is located between orthographic projections of two adjacent dummy wires 610 on the substrate 120. In addition, in other embodiments of the present disclosure, at least one of the first lead wire, the second lead wire, the third lead wire, and the fourth lead wire may also be located outside an area where the foregoing plurality of dummy wires are situated.

When the display panel 1 of this embodiment is applied to a display device, the first bonding portion 10a and the second bonding portion 10b are required to be folded toward a back side of the display substrate 10 by means of the bending portion 61, so that the IC 20 and the circuit board 30 are fixed on a back side of the display substrate 10. The plurality of dummy wires 610 arranged at intervals and substantially perpendicular to the side may improve the bending flexibility so that the layer structure thereof is less likely to break. In some embodiments of the present disclosure, the plurality of dummy wires 610 are located in the aforementioned data metal layer 116. The material of the data metal layer 116 may be titanium aluminum titanium or molybdenum aluminum molybdenum, and the like, which has a favorable ductility, so that the bending portion 61 has a better bending flexibility.

The orthographic projection of any one of the first lead wire 11a, the second lead wire 11b, the third lead wire 13a, and the fourth lead wire 13b on the substrate 120 is located between orthographic projections of two adjacent dummy wires 610 on the substrate 120. In this way, the first lead wire 11a, the second lead wire 11b, the third lead wire 13a, and the fourth lead wire 13b may be protected by the dummy wires 610, so that it is not likely to break due to bending, thereby improving the reliability of the crack detection circuit.

Figure 2C:
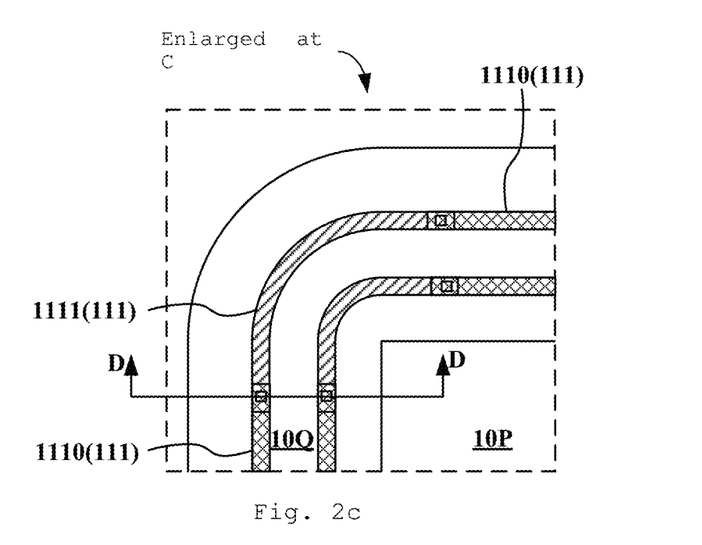
FIG. 2c is a partially enlarged schematic view of C of the display panel shown in FIG. 1.
Figure 2D:
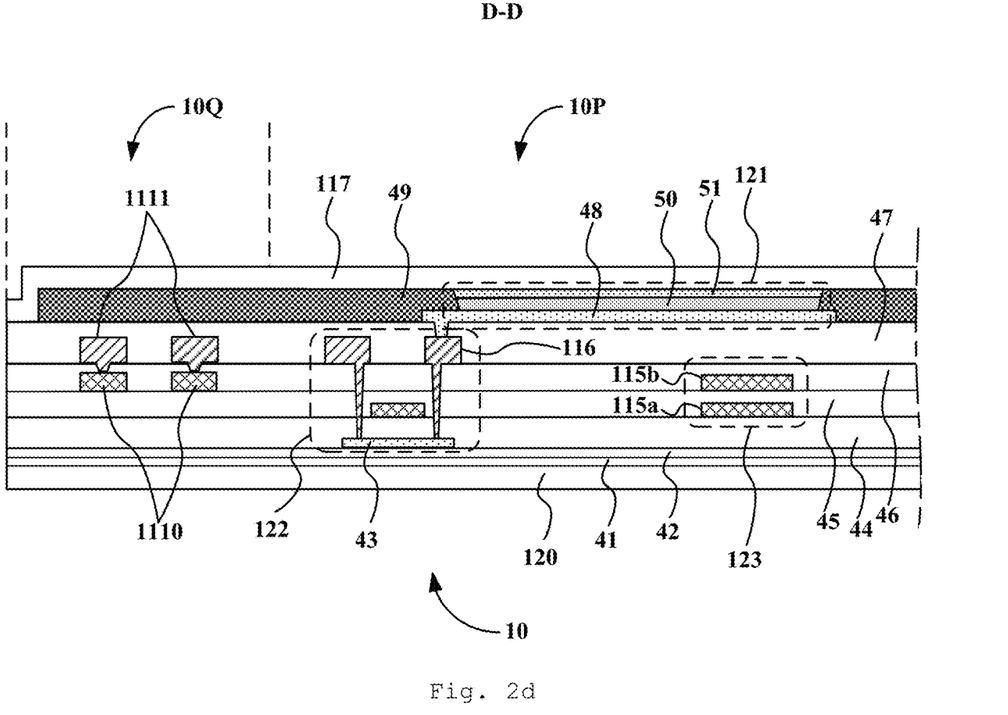
FIG. 2d is a schematic cross-sectional view taken along a D-D direction in FIG. 2c.

As shown in FIGS. 2c and 2d, in some embodiments of the present disclosure, each of the first crack detection line 111 and the second crack detection line 131 includes a plurality of first detection sections 1110 and a plurality of second detection sections 1111 that are alternately connected, wherein the first detection section 1110 is located in the second gate metal layer 115b, the second detection section 1111 is located in the data metal layer 116, and the first detection section 1110 and the second detection section 1111 are connected through a via hole.

The inventors of the present disclosure have noticed that, during the production and transport process of the display panel or the display device, if the trace extends continuously in the same metal layer over an excessive length, it is very likely to be subjected to electrostatic breakdown. In the above-described embodiments of the present disclosure, each of the first crack detection line 111 and the second crack detection line 131 includes a plurality of first detection sections 1110 and a plurality of second detection sections 1111 that are alternately connected and in different layers, and the adjacent first detection section 1110 and second detection section 1111 are connected through a via hole, so that it is possible to effectively reduce the possibility that the crack detection line is subjected to electrostatic breakdown.

The inventors of the present disclosure have also noticed that, due to shape characteristics of the corner area of the display panel, point discharge occurs more likely due to accumulated electrostatic charge, which results in that the trace is subjected to electrostatic breakdown. In some embodiments of the present disclosure, at least one second detection section 1111 is adjacent to the corner of the display area 10P. In this way, it is possible to reduce or even avoid the possibility that the crack detection line is subjected to electrostatic breakdown in the corner area. In addition, the structural design of this embodiment also makes the structures of the first crack detection line 111 and the second crack detection line 131 in the corner area more sensitive to a crack stress, so that it is more likely to be damaged or destroyed by a crack stress. Therefore, it is possible to further improve the sensitivity and accuracy of crack detection.

In the embodiment shown in FIGS. 2c and 2d, the first detection section 1110 is located in the second gate metal layer 115b, and the second detection section 1111 is located in the data metal layer 116. In the structure of the display substrate 10, the total thicknesses of the insulation layers on both sides of the second gate metal layer 115b are substantially the same. The first detection section 1110 with a relatively larger length percentage is arranged in the second gate metal layer 115b. In this way, the first detection section 1110 has substantially the same sensitivity to a stress caused by break of the insulation layer break on either side, so that it is possible to more accurately reflect a crack condition, thereby facilitate more improving the accuracy of crack detection.

As shown in FIG. 1, in some embodiments of the present disclosure, the first crack detection line 111 surrounding the first portion of edges of the display area 10P is in a roundabout shape, and the second crack detection line 131 surrounding the second portion of edges of the display area 10P in a roundabout shape. Such design may significantly increase a total length of the crack detection line within a limited trace area. In the vicinity of the same position, as long as crack or break occurs in any section thereof, the IC 20 may determine that there is a crack on an edge of the display substrate 10. Therefore, the sensitivity and accuracy of detection are further improved.

The lengths of the first crack detection line 111 and the second crack detection line 131 and the roundabout design form used which are not limited, may be designed according to a frame size condition of the display device. For example, in the embodiment shown in FIG. 1, taking into account a narrow frame effect of the display device as an example, the first crack detection line 111 includes two first detection sections 111*a* and one first connection section 1/1*b*, wherein the orthographic projections of the two first detection sections 111*a* on the substrate 120 are arranged at intervals. The second crack detection line 131 includes two second detection sections 131*a* and one second connecting section 131*b*, wherein the orthographic projections of the two second detection sections 131*a* on the substrate 120 are arranged at intervals.

Figure 4:
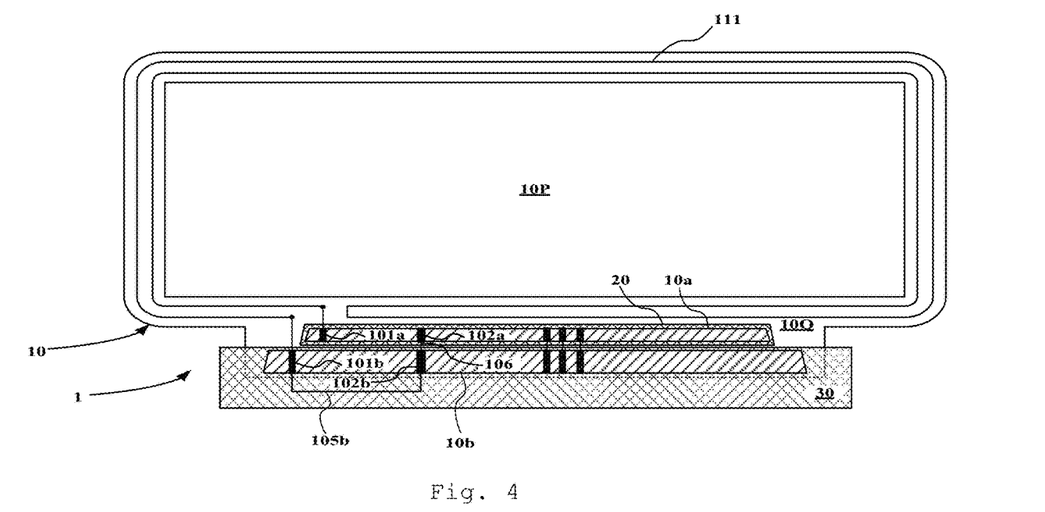
FIG. 4 is a front view of a display panel according to another embodiment of the present disclosure.

As shown in FIG. 4, in other embodiments of the present disclosure, the first connection line includes a first crack detection line 111 that surrounds at least a portion of edges of the display area 10P, and the second connection line is an internal pin 106 connecting the second detection pin 102*a* to the second connection pin 102*b*. The greater the length of an edge of the display area 10P surrounded by the first crack detection line 111 is, the higher the accuracy of detecting a crack on an edge of the display substrate 10 by the IC 20 will be.

Figure 5:
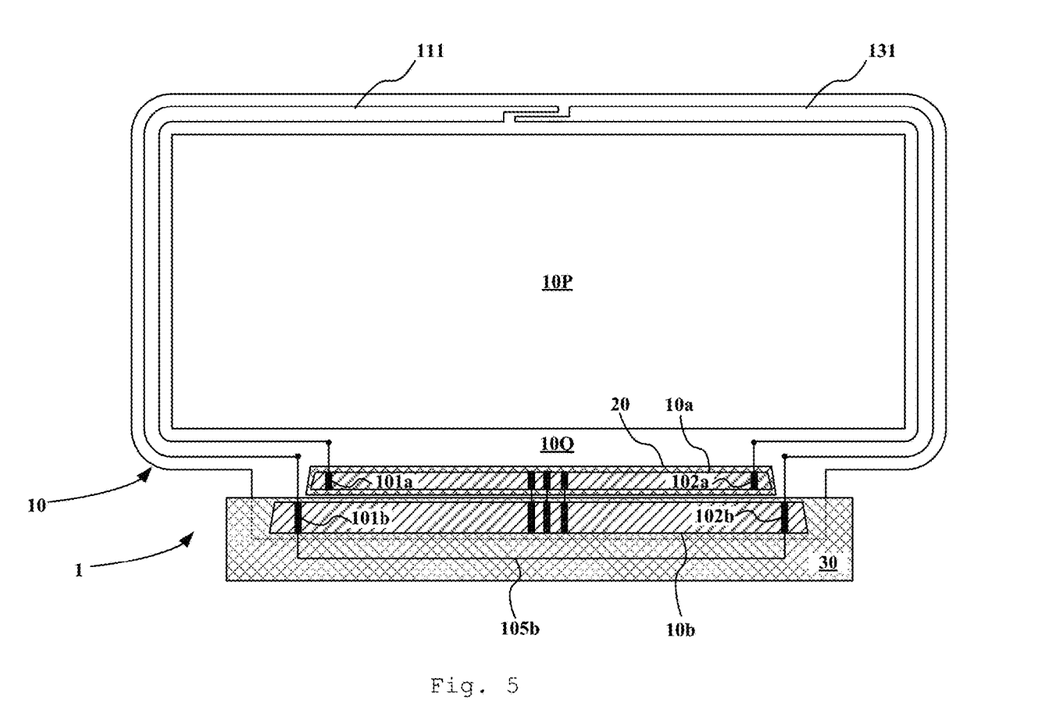
FIG. 5 is a front view of a display panel according to still another embodiment of the present disclosure.

As shown in FIG. 5, in still other embodiments of the present disclosure, the first connection line includes a first crack detection line 111 surrounding the first portion of edges of the display area 10P, and the second connection line includes a second crack detection line 131 surrounding the second portion of edges of the display area 10P, wherein the first portion of edges partially overlaps with the second portion of edges of the display area 10P. This embodiment further increases a length of an edge of the display area 10P surrounded by the crack detection line, thereby further improving the accuracy of detecting a crack on an edge of the display substrate 10 by the IC 20.

Figure 6:
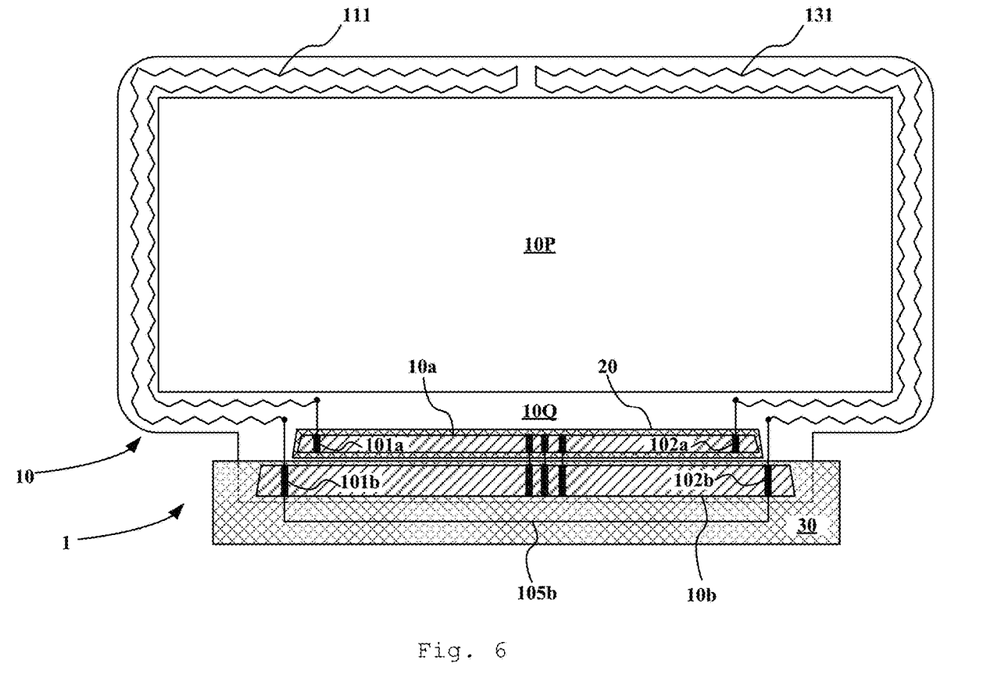
FIG. 6 is a front view of a display panel according to still another embodiment of the present disclosure.

As shown in FIG. 6, in some embodiments of the present disclosure, at least a portion of the first crack detection line 111 extends in a wave form, for example, in a zigzag wave or curved wave form. At least a portion of the second crack detection line 131 extends in a wave form, for example, in a zigzag wave or curved wave form. With this design, it is also possible to increase lengths of the first crack detection line 111 and the second crack detection line 131 within the respective limited trace areas, thereby further improving the sensitivity and accuracy of detecting a crack on an edge of the display substrate 10 by the IC 20.

In some embodiments of the present disclosure, the lengths of the first crack detection line 111 and the second crack detection line 131 are substantially equal. In this way, the probability that a crack on an edge of the display substrate 10 is detected by a crack or break of the first crack detection line 111 is substantially equal to the probability that a crack on an edge of the display substrate 10 is detected by a crack or break of the second crack detection line 131. Moreover, it is also convenient to design and manufacture the traces of the first crack detection line 111 and the second crack detection line 131. The lengths of the first crack detection line 111 and the second crack detection line 131 are substantially equal, and it may be understood that: the difference between the lengths of the first crack detection line 111 and the second crack detection line 131 is within a certain error range.

Figure 7:
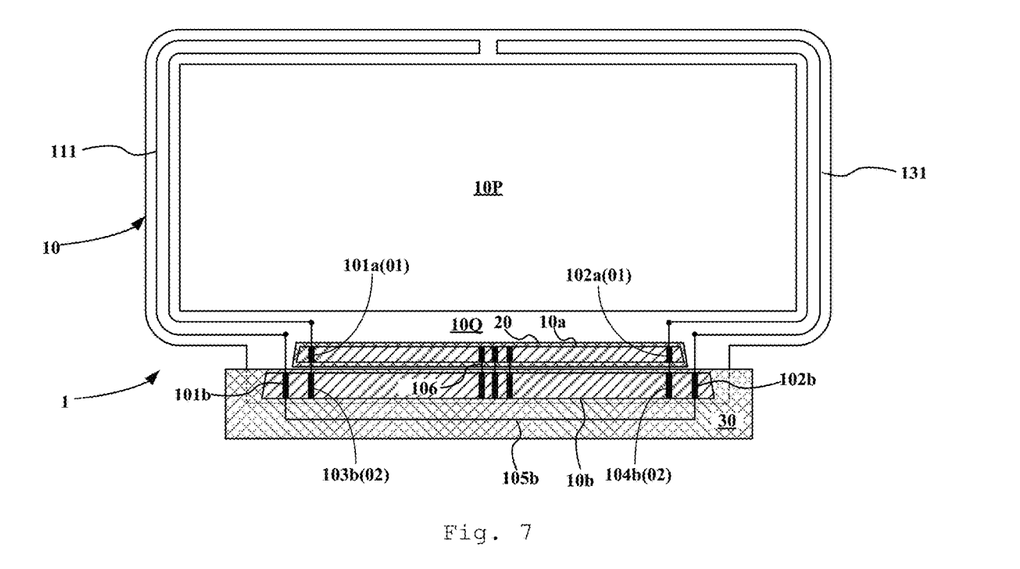
FIG. 7 is a front view of a display panel according to still another embodiment of the present disclosure.

As shown in FIG. 7, in some embodiments of the present disclosure, the plurality of second pins 02 of the second bonding portion 10*b* further includes a first external test pin 103*b* and a second external test pin 104*b*. The first external test pin 103*b* is connected to the first detection pin 101*a* through an internal pin 106, and the second external test pin 104*b* is connected to the second detection pin 102*a* through an internal pin 106. During the manufacturing process of the display substrate 10, it is necessary to test whether the crack detection circuit is qualified. The first external test pin 103*b* and the second external test pin 104*b* are configured to be in external contact with a probe of a voltmeter. By detecting the voltages of the first external test pin 103*b* and the second external test pin 104*b*, it may be determined whether the IC 20 is in normal operation in the crack detection circuit.

Figure 8:
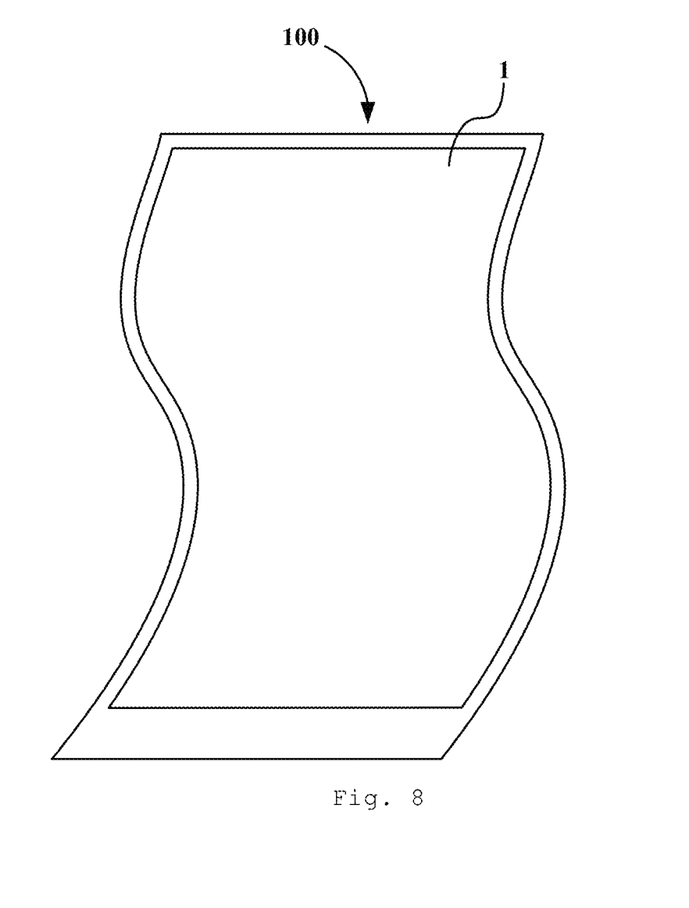
FIG. 8 is a schematic view of a display device according to one embodiment of the present disclosure.

As shown in FIG. 8, the embodiments of the present disclosure also provide a display device 100 including the display panel 1 of any one of the foregoing embodiments. In the embodiment shown in FIG. 8, the display device is a display device including a bendable flexible display panel. In other embodiments of the present disclosure, the display device may also be a display device including a flat display panel, or a display device including a curved display panel. The display device, which is not limited to a specific product type, may be, for example, a display, a computer, a television, a mobile phone, a wearable device, electronic paper, or a display screen and the like.

As described previously, since defective products with a crack on an edge may be screened out during the production stage of the display panel, the display device has a high product quality.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:
1. A display panel, comprising:
a display substrate comprising a display area and a non-display area surrounding the display area, wherein the display substrate comprises a substrate, as well as a first bonding portion, a second bonding portion, a first connection line and a second connection line, which are located on one side of the substrate and located in the non-display area, wherein:
the first bonding portion comprises a plurality of first pins comprising a first detection pin and a second detection pin;
the second bonding portion is located on one side of the first bonding portion away from the display area and connected to the first bonding portion, the second bonding portion comprises a plurality of second pins comprising a first connection pin and second connection pin;

the first connection line connects the first detection pin to the first connection pin, and comprises a first crack detection line arranged around at least a portion of edges of the display area; and the second connection line connects the second detection pin to the second connection pin;

an integrated circuit chip bonded to the first bonding portion, and configured to drive the display substrate to display according to a signal of a main board, and to determine whether there is a crack on an edge of the display substrate according to electric signals of the first detection pin and the second detection pin; and a circuit board bonded to the second bonding portion and configured to transmit a signal of the main board to the integrated circuit chip, wherein the circuit board comprises a connection wire that connects the first connection pin to the second connection pin.

2. The display panel according to claim 1, wherein the second connection line comprises a second crack detection line arranged around at least a portion of the edges of the display area.

3. The display panel according to claim 2, wherein the first crack detection line is arranged around a first portion of edges of the display area, the second crack detection line is arranged around a second portion of edges of the display area, and the first portion of edges does not overlap with the second portion of edges or partially overlap with the second portion of edges.

4. The display panel according to claim 3, wherein:

the first connection line comprises a first lead wire connecting one end of the first crack detection line to the first detection pin, and a second lead wire connecting another end of the first crack detection line b the first connection pin, wherein an orthographic projection of the second lead wire does not overlap with an orthographic projection of the first bonding portion on the substrate; and the second connection line comprises a third lead wire connecting one end of the second crack detection line to the second detection pin, and a fourth lead wire connecting another end of the second crack detection line to the second connection pin, wherein an orthographic projection of the fourth lead wire does not overlap with the orthographic projection of the first bonding portion on the substrate.

5. The display panel according to claim 4, wherein an orthographic projection of the connection wire does not overlap with an orthographic projection of the second bonding portion on the substrate.

6. The display panel according to claim 4, wherein:

the display substrate comprises: a semiconductor layer, a first insulation layer, a first gate metal layer, a second insulation layer, and a second gate metal layer, a third insulation layer and a data metal layer located on one side of the substrate and arranged sequentially along a direction away from the substrate;

each of the plurality of first pins comprises: a first transmission sub-layer located in the first gate metal layer, and a second transmission sub-layer located in the data metal layer and connected to the first transmission sub-layer through a via hole; and each of the plurality of second pins comprises a single-layer transmission portion located in the data metal layer.

7. The display panel according to claim 6, wherein:

the first lead wire and the third lead wire are located in the first gate metal layer; and the second lead wire and the fourth lead wire are located in the second gate metal layer, the second lead wire is connected to the first connection pin through a via hole, and the fourth lead wire is connected to the second connection pin through a via hole.

8. The display panel according to claim 6, wherein:

the substrate is a flexible substrate, the display area is substantially polygonal, and the first bonding portion is adjacent to one side of the display area;

the display substrate further comprises a bending portion located on one side of the substrate and between the display area and the first bonding portion, and the bending portion comprises a plurality of dummy wires that are arranged at intervals and substantially perpendicular to the side, wherein the plurality of dummy wires are located in data metal layer; and an orthographic projection of any one of the first lead wire, the second lead wire, the third lead wire, and the fourth lead wire on the substrate is located between orthographic projections of two adjacent dummy wires on the substrate.

9. The display panel according to claim 6, wherein each of the first crack detection line and the second crack detection line comprises a plurality of first detection sections and a plurality of second detection sections that are alternately provided, wherein the first detection section is located in the second gate metal layer, the second detection section is located in the data metal layer, and the first detection section is connected to the second detection section through a via hole.

10. The display panel according to claim 9, wherein the display area is substantially polygonal, the first bonding portion is adjacent to one side of the display area, and at least one of the second detection sections is adjacent to a corner of the display area.

11. The display panel according to claim 6, wherein:

the second bonding portion is connected to the first bonding portion by a plurality of internal pins which are located in the data metal layer;

the plurality of second pins further comprise a first external test pin and a second external test pin, wherein the first external test pin is connected to the first detection pin through one internal pin, and the second external test pin is connected to the second detection pin through one internal pin.

12. The display panel according to claim 3, wherein:

the first crack detection line surrounding the first portion of edges of the display area is in a roundabout shape; and/or, the second crack detection line surrounding the second portion of edges of the display area is in a roundabout shape.

13. The display panel according to claim 12, wherein at least a portion of the first crack detection line extends in a wave form; and/or at least a portion of the second crack detection line extends in a wave form.

14. The display panel according to claim 12, wherein the first crack detection line and the second crack detection line have substantially the same length.

15. The display panel according to claim 1, wherein the material of the connection wire comprises copper.

16. The display panel according to claim 1, wherein:

the display panel is an organic light-emitting display panel; and the display substrate further comprises an encapsulation layer exposing t plurality of first pins of the first bonding portion and the plurality of second pins of the second bonding portion.

17. A display device comprising the display panel according to claim 1.

* * * * *